(12) United States Patent
Constable et al.

(10) Patent No.: US 10,353,039 B2
(45) Date of Patent: Jul. 16, 2019

(54) SINGLE-ECHO IMAGING WITH NONLINEAR MAGNETIC GRADIENTS

(71) Applicant: Yale University, New Haven, CT (US)

(72) Inventors: Robert Todd Constable, Madison, CT (US); Gigi Galiana, New Haven, CT (US)

(73) Assignee: Yale University, New Haven, CT (US)

( * ) Notice: Subject to any disclaimer, the term of this patent is extended or adjusted under 35 U.S.C. 154(b) by 380 days.

(21) Appl. No.: 15/037,867

(22) PCT Filed: Nov. 20, 2014

(86) PCT No.: PCT/US2014/066569
§ 371 (c)(1),
(2) Date: May 19, 2016

(87) PCT Pub. No.: WO2015/077428
PCT Pub. Date: May 28, 2015

(65) Prior Publication Data
US 2016/0291112 A1 Oct. 6, 2016

Related U.S. Application Data

(60) Provisional application No. 61/963,072, filed on Nov. 22, 2013.

(51) Int. Cl.
*G01R 33/48* (2006.01)
*G01R 33/561* (2006.01)

(52) U.S. Cl.
CPC ...... *G01R 33/5611* (2013.01); *G01R 33/4824* (2013.01); *G01R 33/4826* (2013.01); *G01R 33/561* (2013.01)

(58) Field of Classification Search
CPC .............. G01R 33/3852; G01R 33/365; G01R 33/36509; G01R 33/36518; G01R 33/36536; G01R 33/36572; G01R 33/561; G01R 33/5611; G01R 33/5612; G01R 33/48; G01R 33/4824; G01R 33/4826; G01R 33/56333; G01R 33/3671; G01R 33/4616
See application file for complete search history.

(56) References Cited

U.S. PATENT DOCUMENTS

| | | |
|---|---|---|
| 6,289,232 B1 | 9/2001 | Jakob et al. |
| 7,423,430 B1 | 9/2008 | Sharif et al. |
| 7,906,968 B2 | 3/2011 | Hennig et al. |
| 8,354,844 B2 | 1/2013 | Zaitsev et al. |
| 8,536,870 B2 | 9/2013 | Punchard et al. |
| 2004/0140802 A1 | 7/2004 | Zhang |
| 2009/0091322 A1 | 4/2009 | Posse |

(Continued)

*Primary Examiner* — Son T Le
(74) *Attorney, Agent, or Firm* — Welsh Flaxman & Gitler LLC (57) ABSTRACT

Efficient encoding of signals in an MRI image is achieved through a combination of parallel receiver coils, and nonlinear gradient encoding that varies dynamically in such a manner as to impose a unique phase/frequency time varying signal on each pixel in the field of view. Any redundancies are designed such that they are easily resolved by the receiver coil sensitivity profiles. Since each voxel has an essentially identifiable complex temporal signal, spatial localization is easily achieved with only a single echo acquisition.

14 Claims, 8 Drawing Sheets

(56) References Cited

U.S. PATENT DOCUMENTS

| | | | |
|---|---|---|---|
| 2011/0241673 A1* | 10/2011 | Lin .................... | G01R 33/5611 324/309 |
| 2011/0241675 A1* | 10/2011 | Constable .......... | G01R 33/3415 324/309 |
| 2012/0249137 A1 | 10/2012 | Witschey et al. | |
| 2012/0262171 A1 | 10/2012 | Weber et al. | |
| 2012/0268127 A1 | 10/2012 | Cunningham et al. | |
| 2012/0286783 A1 | 11/2012 | Constable et al. | |
| 2014/0350386 A1* | 11/2014 | Eggers ............... | G01R 33/4828 600/416 |

* cited by examiner

SINGLE-ECHO IMAGING WITH NONLINEAR MAGNETIC GRADIENTS

CROSS REFERENCE TO RELATED APPLICATION

This application is a § 371 of International Application No. PCT/US2014/066569, entitled "SINGLE-ECHO IMAGING WITH NONLINEAR MAGNETIC GRADIENTS", filed Nov. 20, 2014, which claims the benefit of U.S. Provisional Patent Application Ser. No. 61/963,072, entitled "SINGLE-ECHO IMAGING WITH NONLINEAR GRADIENTS," filed Nov. 22, 2013.

This invention was made with government support under EB012289 awarded by National Institute of Health. The government has certain rights in the invention.

FIELD OF THE INVENTION

The invention relates to magnetic resonance imaging. More particular, the invention relates to magnetic resonance imaging using continuous readout with nonlinear magnetic gradients and parallel receiver coils for fast imaging.

BACKGROUND

Magnetic Resonance Imaging (MRI) is notoriously slow. Clinical exams typically take on the order of 1 hour per patient. This severely limits throughput, makes costs high, and decreases the availability of MRI to a broader community. Various efforts have been made in an attempt to increase the speed of image acquisition as increases by even a factor of two could have a significant impact on the cost of health care and open up new applications for MRI.

MRI is a medical imaging technique based on the phenomenon of nuclear magnetic resonance (NMR). In contrast with medical imaging techniques using X-rays, MRI is capable of producing high resolution images for a variety of applications and anatomies without using ionizing radiation. Typically, an MRI scan is initiated by generating a strong magnetic field which Typically, an MRI scan is initiated by generating a strong magnetic field which aligns the magnetic moments of protons (i.e., the nuclei of hydrogen atoms) in the volume of interest (for example, a patient) being scanned. A radiofrequency (RF) pulse is then transmitted into the volume of interest. If the frequency of the RF pulse matches the Larmor frequency of protons in the volume, the pulse may induce a spin-flip transition of the protons from an aligned state to a higher-energy anti-aligned state. When the protons relax after the pulse, they will then emit RF signals at the Larmor frequency which can be detected with receiver coils. The intensity of the detected signal is representative of the concentration of protons in the volume.

The Larmor frequency of a proton is proportional to the strength of the magnetic field. Consequently, if the applied magnetic field is generated with a known spatial gradient, then the Larmor frequency of protons will also have a known spatial localization. Because the frequencies of the detected RF signals from the relaxing protons are known (i.e., the signal data is measured in the frequency domain, or k-space), and because these frequencies are correlated with spatial locations through the known magnetic gradient field, the signal can be transformed from the frequency domain to the spatial domain to produce an image. Because the gradient field provides the correlation between the frequency domain and spatial (or image) domain, it is sometimes called an encoding field.

Conventionally, several orthogonal linear gradients are used in MRI, and several repetition times (TRs) are needed to gather sufficient information to reconstruct an image of the volume. Thus, conventional MRI requires relatively long scan times. For an N×N image, a classic fully-sampled linear gradient data collection scheme requires N repetitions of the basic procedure to generate N lines of k-space (that is, the 2D or 3D Fourier transform of the magnetic resonance image measured). During each repetition time, linear magnetic gradients create plane-wave oscillations in the phase across the image. As the phase variation replicates the kernel of the Fourier transform, the k-space data set is reconstructed via the fast Fourier transform (FFT). When k-space lines are undersampled, aliasing occurs as image fold over.

Researchers have developed various techniques in attempts to reduce scan times. For example, one recent advance in MRI, known as parallel imaging, involves acquiring signals simultaneously with multiple receiver coils. The acquired data can be under-sampled and the resulting aliasing can be unwrapped using receiver coil sensitivity information to produce full images. Parallel imaging methods generally combine spatially-weighted data from multiple simultaneous measurements in order to reduce scan time. Most parallel imaging approaches collect a reduced data set for later interpolation for a Fourier or algebraic reconstruction. By relying on the Fourier reconstruction approach, conventional approaches use orthogonal gradients that complement each other. These gradients, however, can be inefficient with regard to information gathered from the coil sensitivities, resulting in longer scan times and/or reduced image resolution.

Parallel reconstruction conventionally operates on an undersampled frequency domain data set, and data sets from separate coils are either combined in the k-space domain, in the image domain, or a hybrid space. GRAPPA (GeneRalized Autocalibrating Partially Parallel Acquisition), SENSE (Sensitivity Encoding), and SMASH (SiMultaneous Acquisition of Spatial Harmonics) exemplify three known approaches within a Fourier acquisition scheme using linear magnetic gradients for signal encoding. SMASH uses linear combinations of coil sensitivity profiles as a free parameter to shift existing k-space lines to fit omitted data. In order to shift k-space lines, linear combinations of coil profiles must approximate spatially oscillating functions. In practice, coil sensitivity profiles are slowly varying and spatially distinct. The limited flexibility in changing coil profiles makes implementation on an anatomy-constrained geometry difficult.

Parallel imaging, the use of locally sensitive receivers to provide encoding, typically aims to reduce scan time by reconstructing images from a reduced number of timepoints. Sodickson D K, Manning W J (1997) Simultaneous acquisition of spatial harmonics (SMASH): fast imaging with radiofrequency coil arrays. Magnetic Resonance in Medicine 38: 591-603; Jakob P M, Grisowld M A, Edelman R R, Sodickson D K (1998) AUTO-SMASH: a self-calibrating technique for SMASH imaging. Magnetic Resonance Materials in Physics, Biology and Medicine 7: 42-54; Bydder M, Larkman D J, Hajnal J V (2002) Generalized SMASH imaging. Magnetic Resonance in Medicine 47: 160-170; Griswold M A, Jakob P M, Heidemann R M, Nittka M, Jellus V, et al. (2002) Generalized autocalibrating partially parallel acquisitions (GRAPPA). Magn Reson Med 47: 1202-1210; Blaimer M, Breuer F, Mueller M, Heidemann R M, Griswold M A, et al. (2004) SMASH, SENSE, PILS, GRAPPA: how to choose the optimal method. Top Magn Reson Imaging 15: 223-236; Wang Y (2012) Description of parallel imaging in MRI using multiple coils. Magnetic Resonance in Medicine 44: 495-499; Larkman D J, Nunes R G (2007) Parallel magnetic resonance imaging. Phys Med Biol 52: R15-R55; Lustig M, Pauly J M (2010) SPIRiT: Iterative self-consistent parallel imaging reconstruction from arbitrary k-space. Magn Reson Med 64: 457-471; Pruessmann K P, Weiger M, Scheidegger M B, Boesiger P (1999) SENSE: sensitivity encoding for fast MRI. Magnetic Resonance in medicine 42: 952-962; Weiger M, Pruessmann K P, Boesiger P (2002) 2D SENSE for faster 3D MRI. Magnetic Resonance Materials in Physics, Biology and Medicine 14: 10-19; Tsao J, Boesiger P, Pruessmann K P (2003) k-t BLAST and k-t SENSE: Dynamic MRI with high frame rate exploiting spatiotemporal correlations. Magnetic Resonance in Medicine 50: 1031-1042. To facilitate this, several groups, including the inventors of the present invention, have studied whether the geometry of gradient encoding can better complement the information from locally sensitive receivers. Stockmann J P, Ciris P A, Galiana G, Tam L, Constable R T, O-space imaging: Highly efficient parallel imaging using second-order nonlinear fields as encoding gradients with no phase encoding, Magn. Reson. Med., 64(2): 447-456, 2010. Stockmann J P, Galiana G, Tam L K, Nixon T W, Constable R T (2011) First O-Space images using a high-power, actively-shielded 12-cm Z2 gradient insert on a human 3T scanner. Proceedings of the ISMRM 19th Annual Meeting: 717; Stockmann J P G, G., Tam L, Juchem C, Nixon T W, Constable R T (2013) In vivo O-Space imaging with a dedicated 12 cm Z2 insert coil on a human 3T scanner using phase map calibration. Magn Reson Med 69: 444-455; Tam L K, Stockmann J P, Galiana G, Constable R T (2011) Null Space Imaging: Nonlinear Magnetic Encoding Fields Designed Complementary to Receiver Coil Sensitivities for Improved Acceleration in Parallel Imaging. Magnetic Resonance in Medicine 68(4): 1166-75; Gallichan D, Cocosco C, Dewdney A, Schultz G, Welz A, et al. (2011) Simultaneously driven linear and nonlinear spatial encoding fields in MRI. Magnetic Resonance in Medicine 65: 702-714; Schultz G, Weber H, Gallichan D, Witschey W R, Welz A M, et al. (2011) Radial Imaging with Multipolar Magnetic Encoding Fields. IEEE Trans Med Imag 16: 17; Hennig J, Welz A M, Schultz G, Korvink J, Liu Z, et al. (2008) Parallel imaging in non-bijective, curvilinear magnetic field gradients: a concept study. Magnetic Resonance Materials in Physics, Biology and Medicine 21: 5-14. The previous work of the inventors has examined whether this allows a further reduction in the minimum number of echoes due to increased encoding efficiency when the encoding is shared between the magnetic field gradients and the receiver coil sensitivity profiles. This has led to many studies of image encoding with nonlinear gradient shapes, producing good image reconstructions from highly undersampled datasets. Stockmann J P, Ciris P A, Galiana G, Tam L, Constable R T, O-space imaging: Highly efficient parallel imaging using second-order nonlinear fields as encoding gradients with no phase encoding, Magn. Reson. Med., 64(2): 447-456, 2010. Stockmann J P, Galiana G, Tam L K, Nixon T W, Constable R T (2011) First O-Space images using a high-power, actively-shielded 12-cm Z2 gradient insert on a human 3T scanner. Proceedings of the ISMRM 19th Annual Meeting: 717; Stockmann J P G, G., Tam L, Juchem C, Nixon T W, Constable R T (2013) In vivo O-Space imaging with a dedicated 12 cm Z2 insert coil on a human 3T scanner using phase map calibration. Magn Reson Med 69: 444-455; Tam L K, Stockmann J P, Galiana G, Constable R T (2011) Null Space Imaging: Nonlinear Magnetic Encoding Fields Designed Complementary to Receiver Coil Sensitivities for Improved Acceleration in Parallel Imaging. Magnetic Resonance in Medicine 68(4): 1166-75. Previous nonlinear gradient encoding work has also explored single shot trajectories employing EPI (Echo Planar Image)-like readouts. One example is 4D-RIO (4-Dimensional Radial In/Out) which uses an offset radial acquisitions on both linear and nonlinear gradient channels. Layton K J, Gallichan D, Testud F, Cocosco C A, Welz A M, et al. (2012) Single shot trajectory design for region-specific imaging using linear and nonlinear magnetic encoding fields. Magn Reson Med. EPI-like readouts have also been combined with trajectories designed to enhance or sacrifice resolution in different parts of the field of view. Gallichan D, Testud F, Barmet C, Cocosco C, Welz A, et al. (2012) Simultaneous Linear and Nonlinear Encoding in a Single Shot; Proceedings of the 20th ISMRM: 292.

In another approach to reducing scan time, some research has aimed to modify receiver coils, allowing for less data collection and better unwrapping of the aliasing artifacts. This research has focused on increasing the number of receiver coils to localize the sensitivity, only to face issues of ballooning cost and diminishing returns. Recent hardware advances used up to 96 receiver coil elements. Hardware costs increase dramatically with the number of coils since each coil must use a separate receiver, cabling, pre-amplifier, and so on. The difficulty of constructing large coil arrays is nontrivial as elements must be de-coupled. Nearest neighbor approaches through overlapping coils and pre-amplifier decoupling partially addresses inductive coupling of numerous further elements. Increasing coil number reduces the g-factor, a pixel by pixel measure of noise amplification, but drives the cost much higher and exacerbates the decoupling problem. Moving to higher fields and including spatially selective parallel transmission pulses show promise, but fundamentally does not address the underlying encoding problem.

Improvements have been made in SENSE and GRAPPA reconstructions to preserve reconstruction quality, but these penalize acceleration in image acquisition. There has been a trend towards auto-calibration, which has been adopted by SENSE/SMASH as generalized SENSE/SMASH (GSENSE/GSMASH). Another generalization is the expansion of data sampling trajectories to radial and spiral k-space trajectories. For example in radial k-space sampling, an auto-calibration scan (ACS) is collected near the center of k-space during each readout. Using auto-calibration improves image quality at the expense of imaging time by requiring more data collected, or introduces bias by emphasizing low spatial frequency components of the image.

Though sharing a frequency and phase acquisition scheme with Cartesian data, PatLoc (parallel imaging technique with local gradients) performs orthogonal gradient imaging with nonlinear gradients. Non-bijective curvilinear gradients enable faster gradient switching through dB/dt reduction. PatLoc reconstruction relies on the local orthogonality in the magnetic fields to apply a volumetric correction term to the integrand of the signal integral. With the volumetric correction, the image is reconstructed using a fast Fourier transform (FFT). Limiting gradients to a pair-wise orthogonal multi-polar gradient set causes position dependent resolution, with a noticeable absence of signal localization in the center of the image. To date, higher-order gradient encoding has only been performed using custom-built gradient coils.

SUMMARY OF THE INVENTION

It is, therefore, an object of the present invention to provide a method for efficiently encoding signals in an MRI image through a combination of parallel receiver coils, and nonlinear gradient encoding that varies dynamically in such a manner as to impose a unique phase/frequency time varying signal on each pixel in the field of view (FOV). Any redundancies are designed such that they are easily resolved by the receiver coil sensitivity profiles. Since each voxel has an essentially identifiable complex temporal signal, spatial localization is easily achieved with only a single echo acquisition.

Accordingly, it is an object of the present invention to provide a method for increasing imaging speeds in MRI by using nonlinear magnetic gradient fields combined with parallel receiver technology and dynamic modulation of the nonlinear magnetic gradient fields in such a manner that a unique signature is imposed on each region within the field of view such that spatial localization is achieved. The method is achieved by generating nonlinear magnetic gradient fields for spatial encoding of nuclear spin magnetization, applying pulse sequences composed of the nonlinear magnetic gradient fields and radio frequency fields to a targeted subject to generate magnetic resonance signals, detecting the generated magnetic resonance signals, storing the generated magnetic resonance signals, and processing the generated magnetic resonance signals to reconstruct spectra and images of the object.

It is also an object of the present invention to provide a method wherein the nonlinear magnetic gradient fields impose a spatially localizable time/phase/frequency code.

It is another object of the present invention to provide a method including the step of measuring spatial phase and frequency of protons over time.

It is a further object of the present invention to provide a method wherein the step of generating includes electronically combining and rotating C3 (3rd Order Magnetic Gradient defined as $3x^3-3xy^2$) and S3 (3rd Order Magnetic Gradient $3x^2y-y^3$) magnetic gradients, while a Z2 $2^{nd}$ Order Magnetic Gradient (defined as $z^2-(x^2+y^2)/2$ and centered somewhere away from the center of the field of view) amplitude is oscillated.

It is also an object of the present invention to provide a method wherein the step of generating includes electronically combining C2 (2nd Order Magnetic Gradient defined as $x^2-y^2$), S2 (2nd Order Magnetic Gradient defined as xy), C4 (4th Order Magnetic Gradient defined as $x^46x^2y^2+y^4$) S4 (4rd Order Magnetic Gradient defined as $4(yx^3+xy^3)$, and/or Z2 ($2^{nd}$ Order Magnetic Gradient defined as $z^2-(x^2+y^2)/2$)) or a comparable shape to aid in encoding the center of the field of view.

It is another object of the present invention to provide a method wherein a complete image is reconstructed from a single echo.

It is a further object of the present invention to provide a method wherein a complete image is reconstructed from one or more than one echo and if multiple echoes are used each with a different time/phase/frequency code.

It is also an object of the present invention to provide a method wherein the step of applying includes applying the nonlinear magnetic gradient field to impose a unique phase and frequency temporal signal on each voxel in the field of view in order to spatially localize each voxel.

It is a further object of the present invention to provide an MRI system increasing imaging speeds in MRI by using nonlinear magnetic gradient fields combined with parallel receiver technology and dynamic modulation of the nonlinear magnetic gradient fields in such a manner that a unique signature is imposed on each region within the field of view such that spatial localization is achieved. The system includes a magnet housing, a superconducting magnet generating a magnet field $B_0$ to which the patient is subjected, shim coils, gradient coils creating the nonlinear magnetic gradient field critical to the image generation in accordance with the present invention, RF coils, receiver coils, a control system linked to the various operation components of the MRI system under the control of an operator of the MRI system, and a patient table.

It is also an object of the present invention to provide an MRI system including measurement circuitry producing data used to reconstruct images displayed on a display.

It is another object of the present invention to provide an MRI system wherein the nonlinear magnetic gradient field imposes a unique time/phase/frequency code.

It is a further object of the present invention to provide an MRI system wherein the nonlinear magnetic gradient field imposes a unique time course on each pixel in the resulting image.

It is also an object of the present invention to provide an MRI system wherein the nonlinear magnetic gradient field is generated by electronically combining and rotating C3 ($3^{rd}$ Order Magnetic Gradient defined as $3x^3-3xy^2$) and S3 ($3^{rd}$ Order Magnetic Gradient $3x^2y-y^3$) magnetic gradients, while a Z2 $2^{nd}$ order magnetic gradient (defined as $z^2-(x^2+y^2)/2$) (centered somewhere away from the center of the field of view) amplitude is oscillated.

It is another object of the present invention to provide an MRI system wherein the nonlinear magnetic gradient field is generated by electronically combining C2 ($2^{nd}$ Order Magnetic Gradient defined as $x^2-y^2$), S2 ($2^{nd}$ Order Magnetic Gradient defined as xy), C4 ($4^{th}$ Order Magnetic Gradient defined as $x^4+6x^2y^2+y^4$), S4 ($4^{th}$ Order Magnetic Gradient defined as $4(yx^3+xy^3)$, and/or Z2 ($2^{nd}$ Order Magnetic Gradient defined as $z^2-(x^2+y^2)/2$)) or a comparable shape to aid in encoding the center of the field of view.

It is a further object of the present invention to provide an MRI system wherein the MRI system reconstructs a complete image from a single echo.

It is also an object of the present invention to provide an MRI system wherein the MRI system reconstructs a complete image from one or more echoes formed by these combinations of linear and nonlinear gradients.

It is another of the present invention to provide an MRI system wherein the nonlinear magnetic gradient field imposes a unique phase and frequency temporal signal on each voxel in the field of view in order to spatially localize each voxel.

Other objects and advantages of the present invention will become apparent from the following detailed description when viewed in conjunction with the accompanying drawings, which set forth certain embodiments of the invention.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

FIG. 1 shows third order spherical harmonics applied in the creation of a nonlinear magnetic gradient field in accordance with the present invention. An orientation of a nonlinear magnetic gradient field is generated by the appropriate linear combinations of magnetic gradient field G1 and magnetic gradient field G2, wherein FIG. 1(a) shows $G_1$ (defined as $G_1(x,y)=(3x^2-y^2)y$), FIG. 1(b) shows $G_2$ (defined as $G_2(x,y)=(x^2-3y^2)x$) and FIG. 1(c) shows G1 and G2 played together resulting in $G_{1+2}(x,y)=(3x^2-y^2)+(x^2-3y^2)x$. Playing or applying G1 and G2 with cosine and sine amplitude modulation through time respectively generates a nonlinear magnetic gradient field rotating with constant (or variable) angular velocity and the data is sampled (acquired) throughout the gradient modulation period.

FIG. 4 shows a sample pulse sequence for single echo imaging in accordance with the above description and represents a form of the present invention. The sinusoidal variations on the third order channel create a rotating nonlinear third order magnetic gradient field. Meanwhile, since the amplitude modulation on the 1st and 2nd order magnetic fields is different, the flat part of the nonlinear third order magnetic gradient field gradient shifts in space, and the center of the field of view (FOV) is fully encoded. These trajectories encode the entire image in a single shot, and the minimum slew analog on the right could yield a complete image from a single echo that may be as short as 4 ms.

FIG. 5 shows simulation results. Using two phantoms, $64^2$ reconstructions acquired with a standard Cartesian trajectory were compared in accordance with the present invention, and these images were compared with those obtained using the two trajectories diagrammed in FIG. 4. Both the sinusoidal trajectory and lower slew rate analog give excellent reconstructions, though dephasing and the high bandwidth can degrade SNR (signal to noise ratio). However, these reconstructions for single echo data may be acquired in as little as 4 ms (milliseconds).

FIG. 6 shows higher resolution simulations. With the same trajectory and acquisition used in FIG. 5, but reconstructing to a $128^2$ matrix size, (first column) a notable lack of resolution is found, particularly at the center. However, by doubling the length of the acquisition window (second column), the images are greatly improved. An acquisition that achieves the same gradient time product but with a reduced number of points shows little improvement (third column), presumably due to incoherent artifacts related to inadequate sampling bandwidth. It is noted that simulations of the effect of using a two-echo acquisition (fourth column) were attempted, and gains in image quality can be obtained with the additional repetition time.

FIG. 7 maps a metric that reflects localization across the field of view. Using the proposed 8ms trajectory, images of single point objects (a-c) as well as a map of (signal at target voxel)/(mean signal in all other voxels), shown in (d) were generated. As can be seen from the individual single point images, the proposed encoding results in noise-like artifacts distributed throughout the image, leading to a relatively uniform ability to localize signal across the field of view.

DETAILED DESCRIPTION

Referring now to the various drawings, the present invention increases imaging speeds in MRI by using nonlinear magnetic gradients combined with parallel receiver technology and dynamic modulation of these magnetic gradients in such a manner that a unique signature is imposed on each region within the field of view such that spatial localization is achieved.

Before proceeding with the detailed description of the present invention, it is appreciated that MRI uses spatially-varying magnetic fields, termed gradients, in order to spatially localize signals. Fundamentally, magnetic resonance imaging differs from spectroscopy through the use of gradients that assign different frequency codes to separate spatial regions in the area to be imaged. The Larmor precession equation states that the frequency of the RF signal applied in MRI processing be proportional to the magnetic field intensity. While prior research (as discussed above) has focused on efficient methods and apparatuses to encode and localize signals with linear magnetic gradients to achieve faster image acquisition, the present invention employs the nonlinear magnetic gradient fields in a manner designed to complement the spatial encoding contributed by the receiver coils.

In accordance with the present invention, a method for increasing imaging speeds in MRI by using nonlinear magnetic gradient fields combined with parallel receiver technology and dynamic modulation of the nonlinear magnetic gradient fields is disclosed. The method is implemented in such a manner that a unique signature is imposed on each region within the field of view such that spatial localization is achieved. The method requires generating nonlinear magnetic gradient fields for spatial encoding of nuclear spin magnetization and applying pulse sequences composed of the nonlinear magnetic gradient fields and radio frequency fields to a targeted subject to generate magnetic resonance signals. The generated magnetic resonance signals are detected, stored and processed to reconstruct spectra and images of the object.

Figure 8:
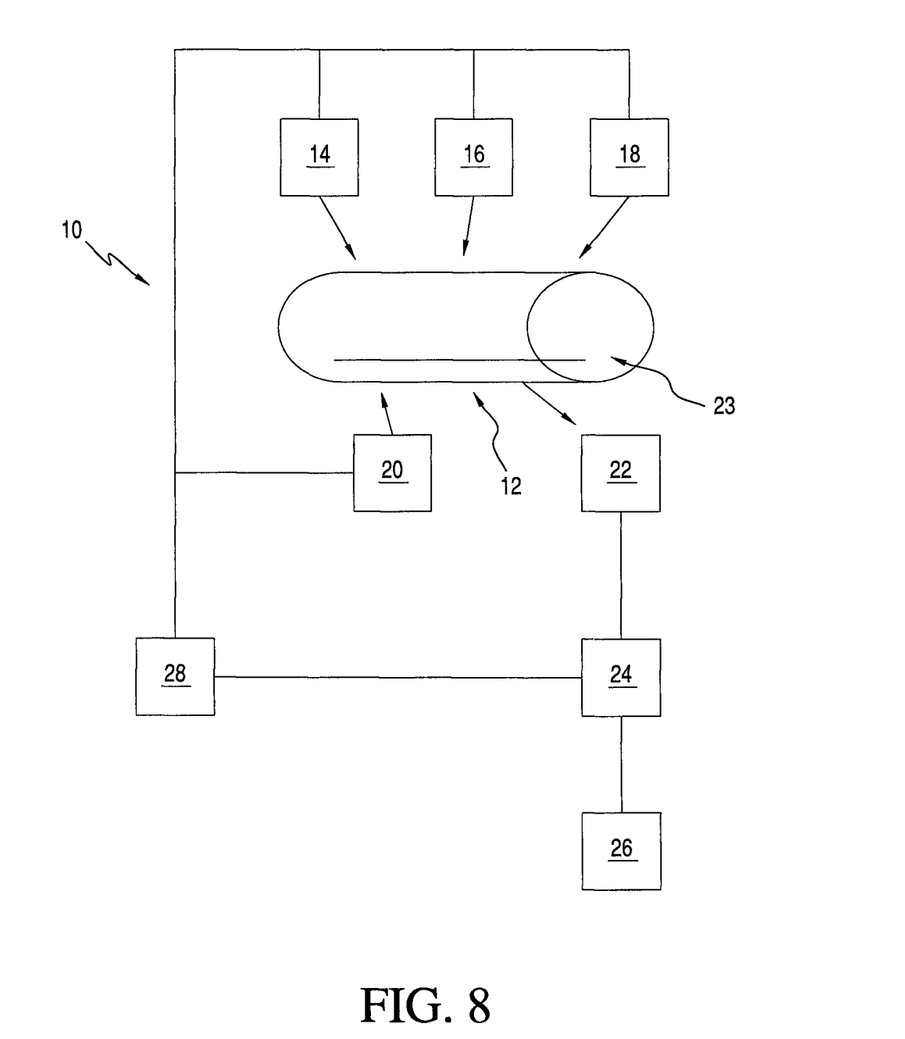
FIG. 8 is a schematic of an MRI system implementing the nonlinear magnetic gradients in accordance with the present invention.

With reference to FIG. 8, the imaging techniques of the present invention are intended for application within an MRI system 10. As is well appreciated by those skilled in the art, a superconducting magnet 14 of the MRI system 10 applies a spatially uniform and temporally constant main $B_0$ magnetic field. Further, excitation of nuclear spin magnetization within the examination volume of the magnetic housing 12 is applied by RF coils 20. More particular, the RF coils 20 apply a radio frequency pulse sequence, the $B_1$ field, which is superimposed perpendicular to the $B_0$ field at an appropriate proton resonant frequency.

These more traditional components of the MRI system 10 are combined with a plurality of magnetic gradient coils 18 that apply nonlinear magnetic gradient fields to the examination volume of the magnetic housing 12. The nonlinear magnetic gradient fields facilitate spatial encoding of the nuclear spin magnetization. During MRI procedures, pulse sequences composed of magnetic gradient fields (applied by the magnetic gradient coils 18) and radio frequency fields (applied by the RF coils) are applied to a targeted subject (such as a live patient) while subject to the temporally constant main $B_0$ magnetic field (applied by the superconducting magnetic 14) to generate magnetic resonance signals, which are detected, stored and processed to reconstruct spectra and images of the object. These procedures determine the characteristics of the reconstructed spectra and images such as location and orientation in the targeted subject, dimensions, resolution, signal-to-noise ratio, and contrast. The operator of the magnetic resonance device typically selects the appropriate sequence, and adjusts and optimizes its parameters for the particular application.

As briefly explained above, a schematic illustration of the MRI system 10 in accordance with the present invention is shown with reference to FIG. 8. As shown, the MRI system 10 includes a traditional magnet housing 12, a superconducting magnet 14 generating the magnet field $B_0$ to which the patient is subjected, shim coils 16, RF coils 20, receiver coils 22, and a patient table 23. The MRI system 10 also includes gradient coils 18 creating the nonlinear magnetic gradient fields critical to the image generation in accordance with the present invention as well as traditional linear magnetic gradient fields. In conjunction with the use of the terminology employed herein it is appreciated (nonlinear field+linear field)=spatially shifted nonlinear field. As such, the resulting field would be considered nonlinear. However, if one is talking about hardware, it is appreciated the linear fields are necessary to do the shifting As is well known in the art, the superconducting magnet 14 produces a substantially uniform magnetic $B_0$ field within its design field of view (FOV). This $B_0$ field is directed along the positive Z-axis. As for the gradient coils 18, the present MRI system 10 employs a plurality of such gradient coils in such orientation necessary to generate the desired nonlinear magnetic gradient field.

The MRI system 10 also includes measurement circuitry 24 producing data used to reconstruct images displayed on a display 26. Preferably, the application of control signals is achieved via a control system 28 linked to the various operational components of the MRI system 10 under the control of an operator of the MRI system 10.

In contrast to the magnetic gradient fields generated by the gradient coils 18 in accordance with the present invention, conventional gradient coils only apply magnetic fields that increase linearly with position in x, y, or z directions. It is appreciated that some known gradient systems use orthogonal gradients that are nonlinear, but these have been designed to produce relatively static fields to reduce magnetic field variation, without regard for encoding readout performance. The present invention leverages the flexibility in magnetic gradient shapes to complement receiver coil sensitivity. As will be appreciated based upon the following disclosure, the set of gradients is designed to impose a unique time/phase/frequency code on each region of the image in a highly efficient manner.

Embodiments of the present invention provide improved MRI techniques using nonlinear magnetic gradient fields that are designed to impose unique codes on voxels within the field of view and where the codes are nonunique they are spatially separated sufficiently such that the parallel imaging receiver coils 22 and associated measurement circuitry 24 can resolve discrepancies in spatial localization, thereby allowing for efficient encoding of spatial information and data acquisition that is robust at very fast acquisition speeds. These nonlinear magnetic gradients are designed to efficiently encode spatial information in MRI such that an image can be produced with as little as a single echo or single line of data.

Through the efficient encoding of spatial information the present invention produces extremely short image acquisition times by using time varied waveforms that collect a single echo, making a $64^2$ image matrix, or higher dependent upon the data acquisition sampling rate, feasible in 4 ms. The present invention allows for the measurement of the accumulated signature of the spin history, that is, the measurement of the spatial phase and frequency of protons over time. The measured signals in accordance with the present invention impose a unique time course on each pixel in the resulting image through the application of rotating nonlinear magnetic gradient fields. Pixels with redundant or similar time courses have an azimuthal symmetry that can be distinguished via receiver coil encoding.

Rather than producing images from a reduced number of echoes, the measured trajectory is designed to minimize the total slew (that is, the rate of change of the magnetic field gradients) of the acquisition, allowing for high bandwidths that acquire the datapoints necessary for a complete image in a minimal amount of time. Block K T, Frahm J (2005) Spiral imaging: a critical appraisal. J Magn Reson Imaging 21: 657-668; Seiberlich N, Lee G, Ehses P, Duerk J L, Gilkeson R, et al. (2011) Improved temporal resolution in cardiac imaging using through-time spiral GRAPPA. Magn Reson Med 66: 1682-1688; Pipe J G, Zwart N R (2013) Spiral trajectory design: A flexible numerical algorithm and base analytical equations. Magn Reson Med. In the present invention these datapoints result in a full 2D image after playing out a single complex waveform on multiple linear & nonlinear gradient channels. Thus, the entire measured trajectory can theoretically be compressed to a 4 ms acquisition time without violating peripheral nerve stimulation (PNS) thresholds. It is appreciated that it does not have to be done in a single complex waveform however and multiple waveforms can be used that add information and improve image quality.

In accordance with an embodiment of the present invention, imaging occurs in the axial plane while electronically combining and rotating C3 ($3^{rd}$ Order Magnetic Gradient defined as $3x^3-3xy^2$) and S3 ($3^{rd}$ Order Magnetic Gradient $3x^2-y^3$) magnetic gradients, while a Z2 $2^{nd}$ Order Magnetic Gradient (defined as $z^2-(x^2+y^2)/2$) (centered somewhere away from the center of the field of view) amplitude is oscillated. It is appreciated these magnetic gradients can be rotated/ramped in a nonlinear manner (for example in a sinusoidal fashion) or with linear ramp times but other combinations of higher order gradient terms could be used. The result is highly efficient spatial encoding of the protons being monitored that allows a complete image to be reconstructed from a single echo. It is however appreciated the concepts underlying the present invention are not limited to single echo imaging and higher image quality can be achieved if multiple echoes are obtained. It is also noted that these types of voxel signatures can be imposed with other gradient shapes such as C2 ($2^{nd}$ Order Magnetic Gradient defined as $x^2-y^2$), S2 ($2^{nd}$ Order Magnetic Gradient defined as xy), C4 ($4^{th}$ Order Magnetic Gradient defined as $x^4+6x^{2y^2}+y^4$), S4 ($4^{th}$ Order Magnetic Gradient defined as $4(yx^3+xy^3)$), and/or Z2 ($2^{nd}$ Order Magnetic Gradient defined as $z^2-(x^2+y^2)/2$)) or a comparable shape to aid in encoding the center of the field of view. A further extension could be the imposition of such time/phase/frequency signatures using transmit RF pulses rather than magnetic field gradients. The reduction of the spatial encoding to a single echo allows imaging times of the order of 4 ms (using magnetic gradients that fall within the safety limits of dB/dt).

As a result, the present invention relies upon sequences where the nonlinear magnetic gradient fields vary in time to acquire the desired image in a single readout. The readout is designed to be very smooth so that it can be compressed to minimal time without violating peripheral nerve stimulation limits, yielding an image from a single 4 ms echo. This sequence is inspired by considering the code of each voxel, that is, the phase accumulation that a voxel follows through the readout (that is time), an approach connected to traditional encoding theory. Simulations are presented for the initial sequence, a low slew rate analog, and higher resolution reconstructions. The present invention results in extremely fast acquisitions (image acquisition in a single <10 ms echo), though as those skilled in the art would appreciate, SNR is reduced relative to the slower Cartesian sampling schemes if a higher bandwidth is used or overall less data is collected.

The shift in point of view that motivated the family of trajectories underlying the present invention and based upon the application of nonlinear magnetic gradient fields was considering gradient encoding as a means of applying a unique phase/frequency time code or signature to each pixel in the image. As explained below, this timecourse is considered to be the code of that pixel. The code of a pixel at (x,y) can be written as:

$$S(x,y,t,l) = C_l e^{i \int G(x,y,t) dt} \qquad [1]$$

where x is the position of the pixel along the x-axis at time t;
y is the position of the pixel along the y-axis at time t; and
l is the index for the receiver coil sensitivity $C_l$.

It is also understood that e is the exponential function, Euler's number ~2.72 and i is the standard nomenclature for complex numbers $(-1)^{1/2}$. G is the exponent describing the temporally changing magnetic field across space expressed in units of Hz.

So long as the code of a pixel is unique and the noise is sufficiently low, the magnitude of the signal coming from that pixel can be measured over time and used in imaging.

This assertion is further justified by connecting it to the matrix methods that are increasingly used to reconstruct MR images. Typically, the reconstruction problem is defined as the solution, x, that satisfies: Ax=b, where b is the measurement data, A is the encoding matrix, and x is the object or image. Herman G T, Lent A (1976) Iterative reconstruction algorithms. Computers in biology and medicine 6: 273-294; Herman G T (1995) Image reconstruction from projections. Real-Time Imaging 1: 3-18; Kadah Y M, Hu X (1998) Algebraic reconstruction for magnetic resonance imaging under B/sub 0/inhomogeneity. Medical Imaging, IEEE Transactions on 17: 362-370; Lin F H, Kwong K K, Belliveau J W, Wald L L (2004) Parallel imaging reconstruction using automatic regularization. Magnetic Resonance in Medicine 51: 559-567; Pruessmann K P (2006) Encoding and reconstruction in parallel MRI. NMR in Biomedicine 19: 288-299; Block K T, Uecker M, Frahm J (2007) Undersampled radial MRI with multiple coils. Iterative image reconstruction using a total variation constraint. Magnetic Resonance in Medicine 57: 1086-1098; Seiberlich N, Breuer F A, Blaimer M, Barkauskas K, Jakob P M, et al. (2007) Non-Cartesian data reconstruction using GRAPPA operator gridding (GROG). Magnetic Resonance in Medicine 58: 1257-1265; Schultz G, Ullmann P, Lehr H, Welz A M, Hennig J, et al. (2010) Reconstruction of MRI data encoded with arbitrarily shaped, curvilinear, nonbijective magnetic fields. Magnetic Resonance in Medicine 64: 1390-1403. One typically describes A as being assembled row by row. Each row describes the encoding $A_i$ being applied when datapoint $b_i$ is measured. Thus, each row captures the equation: $A_i x = b_i$ However, and as applied to the concepts underlying the present invention, this same encoding matrix may be described as being assembled column by column. Each column describes the code followed by a given pixel over the full course of the acquisition. From this perspective, the matrix equation can be understood as a decomposition of different time courses, like those commonly used across a range of general linear models including in task-based functional MRI. Friston K J, Frith C D, Frackowiak R S, Turner R, Characterizing dynamic brain responses with fMRI: a multivariate approach, Neuroimage 1995, 2(2): 166-172. Norris D G (2006) Principles of magnetic resonance assessment of brain function. J Magn Reson Imaging 23: 794-807; Poline J B, Brett M (2012) The general linear model and fMRI: does love last forever? Neuroimage 62: 871-880. The object vector is equivalent to the weight vector solved for in fMRI studies (the task for example in such studies), and the weight of signal that follows a given code tells us the density of spins in a given pixel.

Requiring a unique code for each pixel is equivalent to requiring that the columns of the encoding matrix be linearly independent to resolve the image. If two pixels have identical codes due to gradient evolution (i.e., if two columns are identical), those pixels "fold" on top of each other. However, just as in SENSE (Sensitivity Encoding), these pixels can be unfolded so long as the receiver coil weightings on the folded pixels are not identical. In terms of the encoding matrix, the receiver coil weightings create differently weighted versions of the timecourse code, so that previously identical columns become linearly independent.

The purpose of such sequences is to impose a unique code via the application of nonlinear magnetic gradient fields on each voxel. With this in mind, a scheme is applied such that voxels with the same gradient code are distant in space so that the receiver coil weightings may distinguish them. Furthermore, to achieve very fast acquisitions, very smooth gradient waveforms that could be played out in a single acquisition window are utilized.

Figure 1:
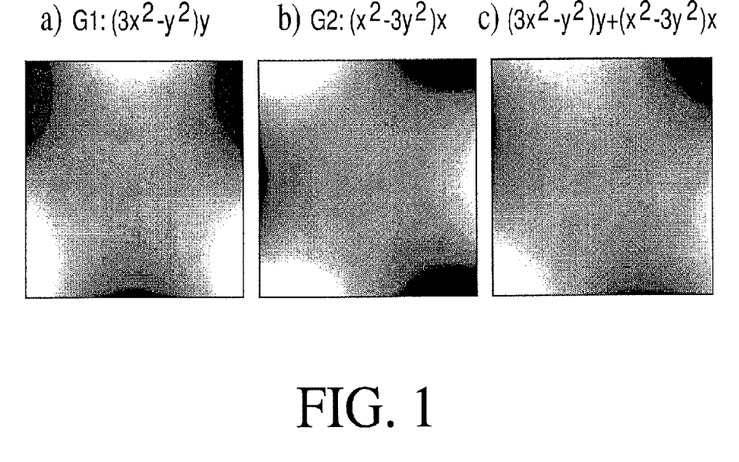

One nonlinear magnetic gradient field that produces an interesting code is that of a rotating l=3, |m|=3 spherical harmonic, as shown in FIG. 1. In practice, any rotated version of that nonlinear magnetic gradient field can be achieved by playing different proportions of the following third order magnetic fields (Note: The term "playing" as used here refers to running current through the gradient coil to produce a magnetic field with specific temporal and spatial gradient features (amplitudes), in the future it may also be possible to achieve similar spatial codes with RF pulses alone or in combination with such gradients):

$$G_1(x,y) = (3x^2 - y^2)y \ \& \ G_2(x,y) = (x^2 - 3y^2)x \qquad [2]$$

as shown in panels 1(a)-(c) of FIG. 1, wherein FIG. 1(a) shows $G_1$, FIG. 1(b) shows $G_2$ and FIG. 1(c) shows $G_1$ and $G_2$ played together resulting in $G_{1+2}(x,y) = (3x^2 - y^2) + (x^2 - 3y^2)x$. If $G_1$ is played with a cosine amplitude modulation and $G_2$ is played with a sine amplitude modulation, the magnetic field is rotated through $\pi/3$, which returns us to the initial orientation and spins anywhere in the FOV as they are dephased and rephased in this cycle.

Figure 2:
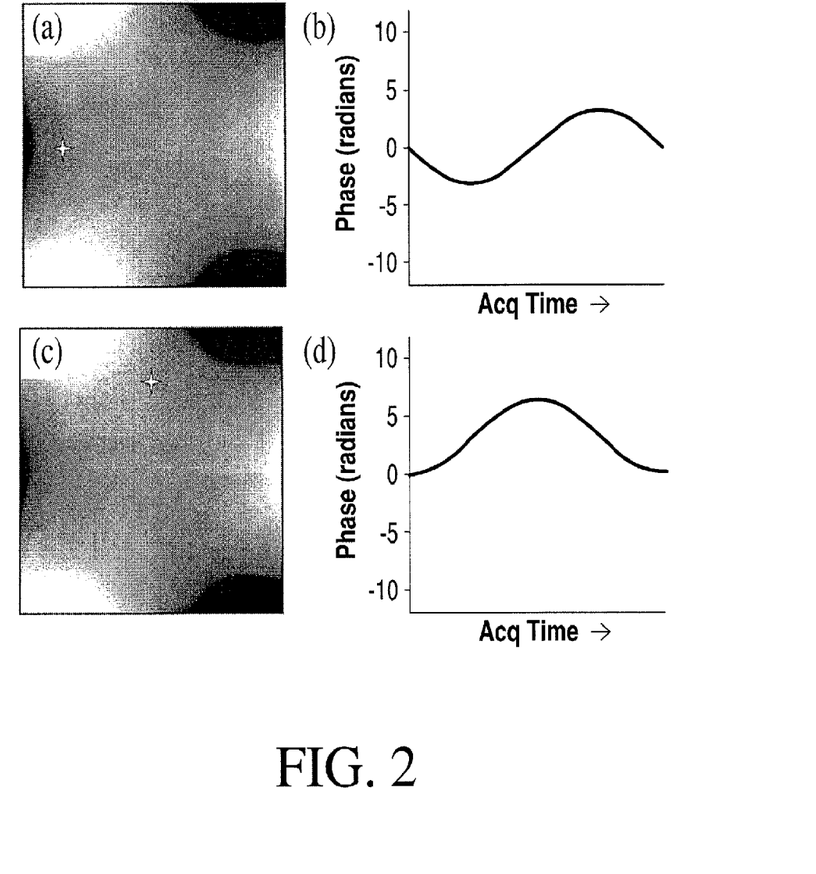
FIG. 2 shows the code for peripheral voxels under a rotating nonlinear third order magnetic gradient field. Evolving under a rotating version of the nonlinear third order magnetic gradient field shown in (a), the highlighted voxel accumulates a sinusoidal phase that returns to zero over a full π/3 rotation of the nonlinear third order magnetic gradient field. A voxel at the same radius but a different angular position has the same amplitude of variation, but follows a sinusoidal phase code with different phase.

FIG. 2(b) shows the code of the marked pixel (FIG. 2(a)) evolving under this nonlinear magnetic gradient field as it rotates clockwise. The pixel begins accumulating negative phase at a rapid rate, but as rotation continues, this rate decreases to zero as the null region of the nonlinear magnetic gradient field approaches the pixel. Next the pixel begins to accumulate positive phase, which it continues to do as the positive lobe of the nonlinear magnetic gradient field passes over it. The pixel reaches its maximum positive phase when the next null reaches it, and it then rephases to its initial phase as it is traversed by the next half of the blue lobe (see upper and lower right hand corners of the image in FIG. 2(b)).

This phase code may also be solved analytically. The spatial magnetic gradient field, G, as a function of time is:

$$G(x,y,t)=\cos(\omega t)\{3x^2-y^2\}x+\sin(\omega t)\{x^2-3y^2\}y \quad [3]$$

where t samples each dwell time of the acquisition and $\omega$ is $2\pi$ divided by the total acquisition time. Then the argument of the exponential in Equation 1, the temporal code of a voxel at (x,y), is:

$$i\int_0^t G(x,y,t)d\tau \propto \sin(\omega t)\{3x^2-y^2\}x-\cos(\omega t)\{x^2-3y^2\}y=c_1\sin(\omega t)-c_2\cos(\omega t) \quad [4]$$

Thus, over the entire rotation, the temporal code of any pixel will have the shape of a sine wave. The amplitude of the sine wave will be proportional to its distance from the center, and the starting phase is related to its azimuthal position. (See FIGS. 2(c) and 2(d) for the location and code of a voxel at the same radius but different azimuthal position.) Furthermore, every voxel returns to its initial phase over the entire trajectory, so this is a self-refocused code. Voxels at the same radius and $\pi/3$ radians apart will receive the same phase code, but these are easily distinguished by the receiver coil sensitivity encoding, especially at the periphery of the FOV.

Figure 3:
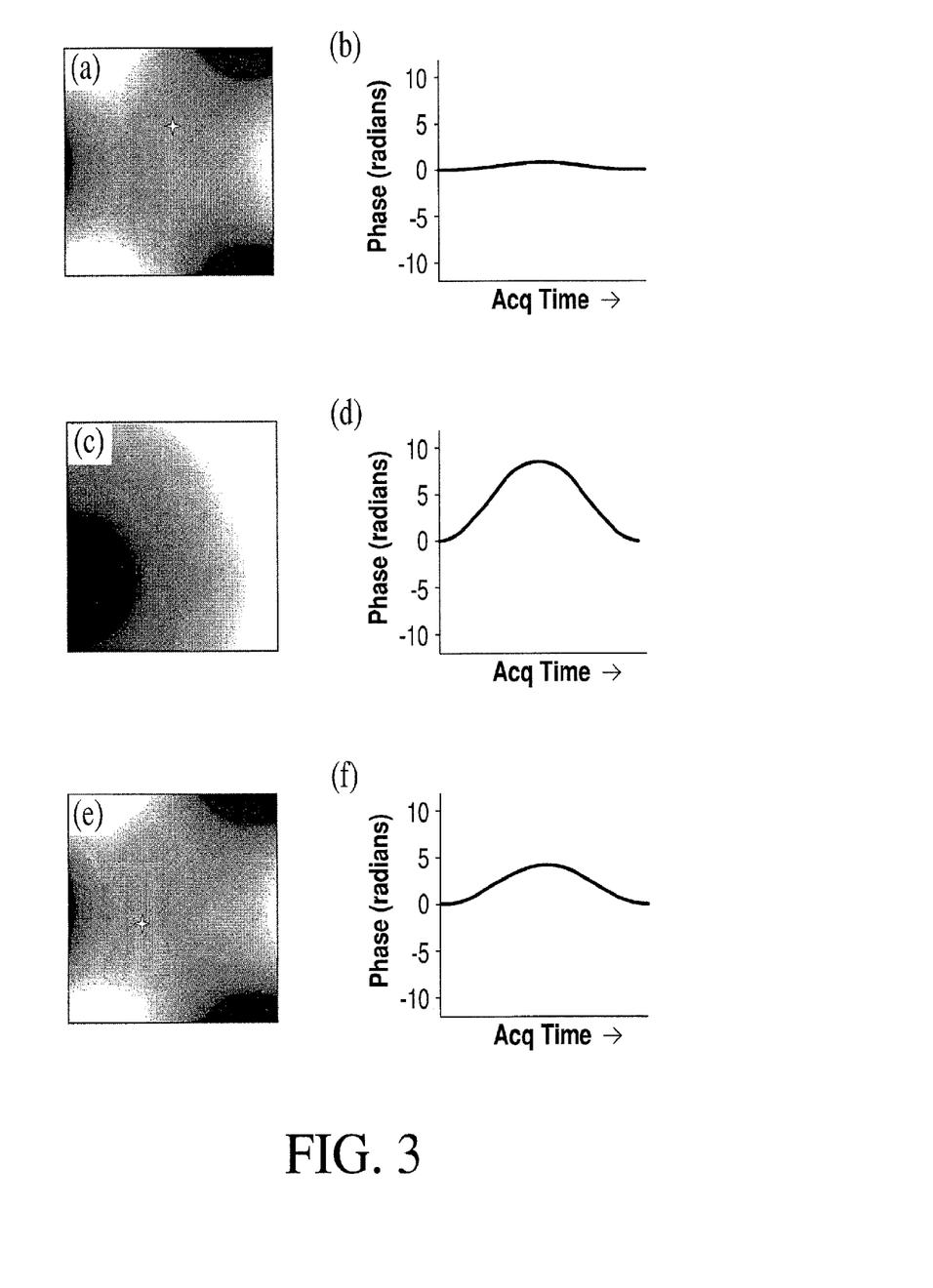
FIG. 3 shows the code for central voxels under a rotating nonlinear third order magnetic gradient field. Evolving under just the rotating nonlinear third order magnetic gradient field, a voxel such as that marked in (a) has little phase variation over the acquisition. This is remedied by adding an offset 2nd order magnetic gradient field like that shown in (b), using a combination of x, y, and z2 gradient shapes. Giving this magnetic gradient field a cosine amplitude modulation, the relatively flat part of the magnetic gradient field changes both position and shape during the acquisition. This creates the code seen in (d) for the same voxel. Voxels close to the nominal center placement, like the voxel highlighted in (e) also have a significant code imposed on them (f) because the flat part of the magnetic gradient field moves during the acquisition.

The weakness of this simple code is that the amplitude of the sine wave diminishes near the center of the field of view, which is also where receiver coil encodings become least distinct. This can make voxels difficult to distinguish, as can be seen in FIG. 3. Here is shown a voxel closer to the center of the FOV (see FIG. 3(a)) and its time course (see FIG. 3(b)).

To address this limitation, a magnetic gradient field with the shape of $(x-x_0)^2+(y-y_0)^2$ is added, with $x_0=-0.45$ FOV and $y_0=-0.19$ FOV. This magnetic gradient field can then be played out with an amplitude modulation that is out of phase with magnetic gradient field $G_1$ and in phase with magnetic gradient field $G_2$. The spatial shape of this additional magnetic gradient field, which in practice is created by a linear combination of the x, y, and $z^2-\frac{1}{2}(x^2+y^2)$ gradients, is shown in FIG. 3(c), and is similar to the magnetic gradient fields used in O-space imaging. Stockmann J P, Ciris P A, Galiana G, Tam L, Constable R T, O-space imaging: Highly efficient parallel imaging using second-order nonlinear fields as encoding gradients with no phase encoding, Magn. Reson. Med., 64(2): 447-456, 2010. Stockmann J P, Galiana G, Tam L K, Nixon T W, Constable R T (2011) First O-Space images using a high-power, actively-shielded 12-cm Z2 gradient insert on a human 3T scanner. Proceedings of the ISMRM 19th Annual Meeting: 717; Stockmann J P G, G., Tam L, Juchem C, Nixon T W, Constable R T (2013) In vivo O-Space imaging with a dedicated 12 cm Z2 insert coil on a human 3T scanner using phase map calibration. Magn Reson Med 69: 444-455. In general, adding linear components to the Z2-gradient only shifts the location of the field's flat region or center. However, because the strength of the linear magnetic gradient fields changes during acquisition, the flat region of the composite field is translated across the field of view during the readout. Though the relative proportions of $G_{z2}$, $G_x$, and $G_y$ may remain constant, which corresponds to a constant center placement of the $G_{z2}$ field, the changing proportion of G1 causes the saddle of the composite field to shift during the readout. Simultaneously, the changing proportions of nonlinear gradients also cause variations in the topology of the field, from a pure G1/G2 combination, like those shown in FIG. 1, to a stretched out version that results from adding $z^2-\frac{1}{2}(x^2+y^2)$ gradient. The $z^2-\frac{1}{2}(x^2+y^2)$ term is off center and thus introduces a steep gradient across the center of the FOV where the G1/G2 gradients are flattest thus allowing one to resolve spins in the center of the FOV.

FIG. 3(d) shows the phase accumulation of this same voxel (FIG. 3(a)) using the modified trajectory. Since this additional magnetic gradient field could increase the overall bandwidth of the acquisition, the third order magnetic gradient fields are scaled accordingly to maintain the same bandwidth. In addition, a voxel closer to the valley of the additional magnetic gradient field (FIG. 3(e)) and its code (FIG. 3(f)) is shown. These voxels now both have significant and distinct phase/frequency excursions that can be used to distinguish their codes.

Methods

Images were encoded using rotated versions of the magnetic gradient fields shown in FIG. 1. This was simulated by applying linear combinations of magnetic gradient fields like those shown in FIG. 4. The data acquisition (readout) sampled 4096 points, and encoding was simulated in Matlab at a $64^2$ matrix size. Noise was added to each timepoint from a white Gaussian distribution, which was adjusted to provide an SNR equivalence of approximately 100 for Cartesian images. The simulations used experimental receiver coil profiles from an 8 channel coil. To capture intravoxel dephasing at the edge of the field of view, the encoding matrix was calculated at a resolution of $256^2$ and then summed over the 4×4 square corresponding to coarser voxels. This downsampled encoding matrix was used for both data generation and image reconstruction. Reconstruction was performed with a Kaczmarz algorithm with 5 iterations. Stockmann J P, Ciris P A, Galiana G, Tam L, Constable R T, O-space imaging: Highly efficient parallel imaging using second-order nonlinear fields as encoding gradients with no phase encoding, Magn. Reson. Med., 64(2): 447-456, 2010. Stockmann J P, Galiana G, Tam L K, Nixon T W, Constable R T. First O-Space images using a high-power, actively-shielded 12-cm Z2 gradient insert on a human 3T scanner. Proceedings of the ISMRM 19th Annual Meeting 2011:717. 23; Kadah Y M, Hu X. Algebraic reconstruction for magnetic resonance imaging under $B_0$ inhomogeneity. Medical Imaging, IEEE Transactions on 1998; 17(3):362-370. The reconstruction included both gradient and receiver coil encoding in a single matrix, making this a true parallel imaging reconstruction.

To study higher resolution reconstructions, simulated reconstructions were done with longer acquisition times and larger reconstruction matrix sizes. For $128^2$ images, the encoding matrix was again 4-fold oversampled in space and binned down to capture intravoxel dephasing, and noise was added by the same procedure. Longer acquisitions were explored several ways: 1) by considering the same shapes and number of points but with twice the dwell time, leading to a longer acquisition window 2) by considering the longer acquisition window, but maintaining the dwell time, leading to more data points, and 3) by acquiring more than one echo. In the two echo simulations, the first echo uses linear and second order magnetic gradient fields that create $G(x,y)=(x-x_0)^2+(y-y_0)^2$, while the second echo uses the magnetic gradient field $G(x,y)=(x+x_0)^2+(y+y_0)^2$. The amplitude modulation and the higher order gradient shapes are otherwise the same.

To study the point spread function (PSF) properties of the reconstruction, reconstructions of single point images were performed for each position in the FOV using simulation for the sinusoidal trajectory in accordance with the present invention. These were also performed at $64^2$ matrix resolution, with noise adjusted to an SNR of 150, and using experimental receiver coil sensitivity profiles which were windowed to the diameters of the bore of the receiver coil before being included in the reconstruction matrix. For each single point image, a metric reflecting the localization of the PSF was calculated by calculating the signal intensity at the occupied voxel divided by the mean of signal intensity at all other voxels in the image.

Results

Figure 4:
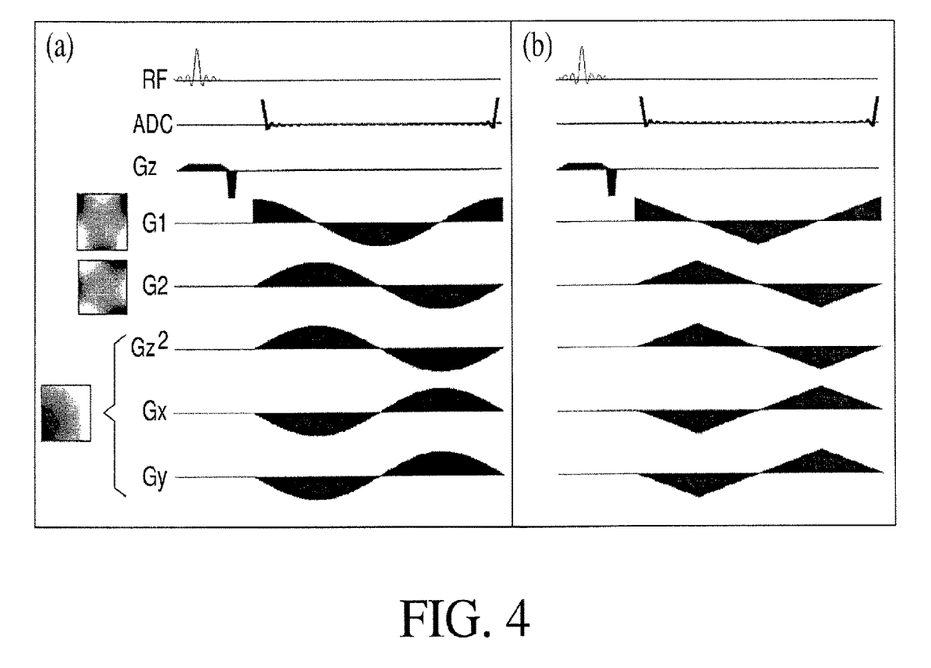

FIG. 4(a) shows the basic pulse sequence for the rotating magnetic gradient field trajectory, with cosine and sine amplitude modulations on the gradients. Limiting the gradient slew rate to 45T/s over the 20 cm field of view (a limit commonly imposed on clinical scanners), it is found that this readout, which acquires the entire image, can be played out in 8.2 ms. An acquisition time this short could be achieved with the following maximum amplitudes for each magnetic gradient field: 1800 Hz/cm, 180 Hz/cm$^2$, and 1400 Hz/cm$^3$ for the $1^{st}$, $2^{nd}$, and $3^{rd}$ order magnetic gradient fields, respectively. Because magnetic gradient fields are steepest at the edge of the field of view, imaging over larger areas would require lower bandwidth acquisitions and longer readouts, but projections in accordance with the present invention would apply to normal brain imaging using a head insert to generate the nonlinear magnetic gradient fields.

To test the limits of fast imaging with this sequence, a trajectory like that shown in FIG. 4(b) was also studied. This linearized trajectory reduces the maximum slew rate on each channel and would theoretically allow one to acquire the data in 4.3 ms without exceeding the mean threshold for peripheral nerve stimulation discomfort (55T/s) over a 20 cm field of view. Schaefer D J, General Electric Medical Systems W, Wisconsin 53188, General Electric Medical Systems W, 3200 North Grandview Blvd., Waukesha, Wis. 53188, Bourland J D, Department of Biomedical Engineering PU, West Lafayette, Ind. 47907, et al. Review of Patient Safety in Time-Varying Gradient Fields. Journal of Magnetic Resonance Imaging 12: 20-29. This acquisition scheme would imply a dwell time of approximately 1 μs. Maximum amplitudes along each channel would need to be approximately doubled to achieve the same encodings over these shorter dwell times.

Note that in both these pulse sequence diagrams, the sequences and signals are shown in an arrangement that produces codes like those shown in FIGS. 2 and 3. Thus the signal begins and ends at its fully rephased state, reflecting the analysis described above. However, a symmetric echo can easily be achieved with little additional time penalty. In practice, this could be accomplished by simply running the sinusoidal trajectories for an extra half-cycle and reading out the data in the last two thirds of the trajectory. This would also place the echo at the center of the readout, which is typically the best way to collect an echo.

Figure 5:
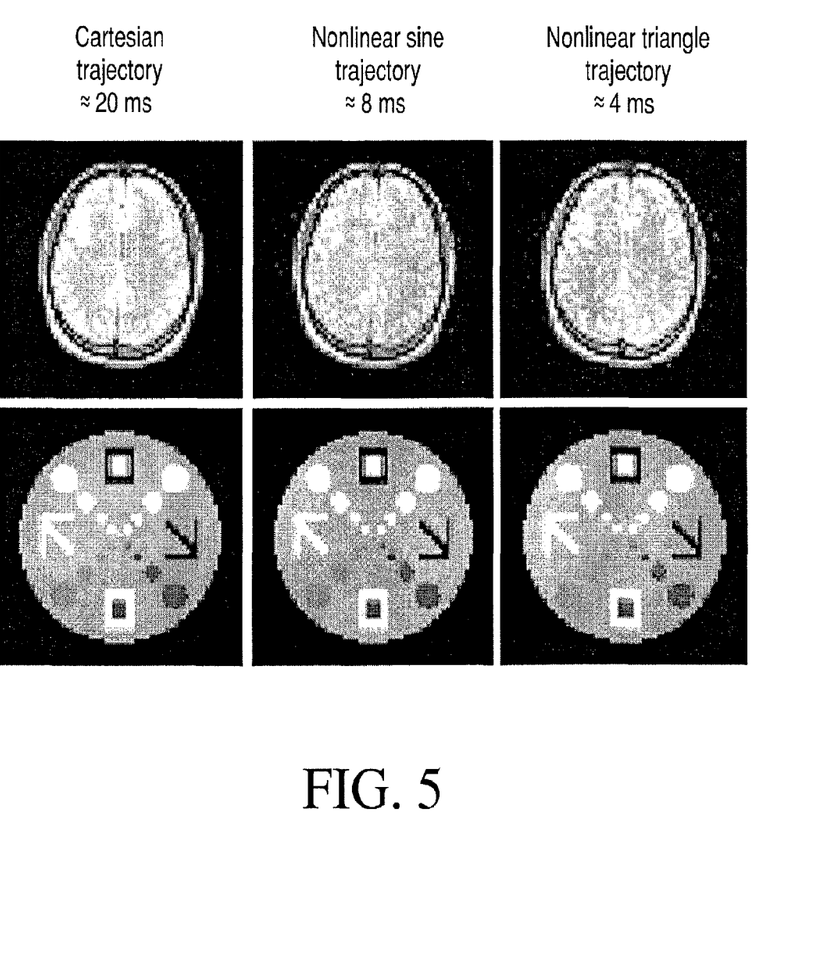

FIG. 5 shows reconstructions of images simulated from acquisitions with both the sinusoidal and triangular trajectories described above. The first column shows two phantoms reconstructed using a standard Cartesian sampling scheme. If acquired in an echo planar acquisition, this would correspond to a minimum acquisition time of approximately 20 ms. The next two columns show these phantoms as reconstructed from the trajectories shown in FIGS. 4(a) and 4(b), respectively. These images show good image reconstruction, though noise levels are higher than in the corresponding Cartesian trajectory. However, these images are generated by a single echo that is extremely short and potentially allowing unprecedented temporal resolution.

Figure 6:
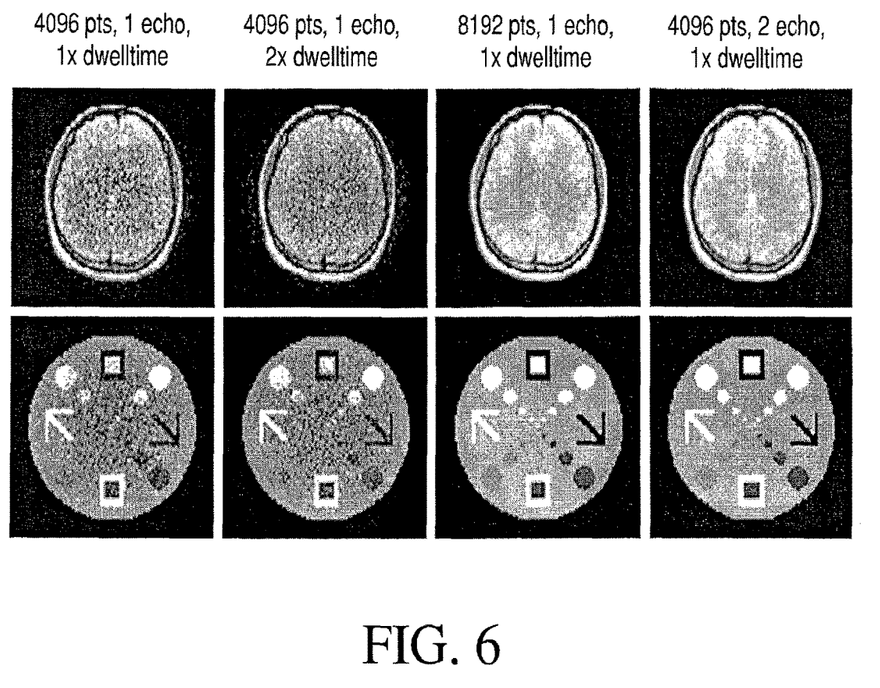

To achieve higher resolution reconstructions, various trajectory modifications were studied, with those results shown in FIG. 6. The first column shows reconstructions of the same data used to reconstruct the $64^2$ images of FIG. 5 but here used to reconstruct a $128^2$ image. The next two columns show reconstructions of acquisition windows that would be twice as long. The longer acquisition window would either result from acquiring the same number of points, but doubling the dwell time, as shown in the second column. This is equivalent to doubling the gradient strength but, relative to the aforementioned acquisitions run at maximum slew, this could only be achieved by increasing dwell time. In the third column, the longer acquisition uses the original gradient strengths and dwell times but acquires twice the number of points. This shows a significant improvement in the reconstruction. Finally, acquiring twice the original data over two repetitions of the sequence was considered. In the second repetition, a different $(x_0,y_0)$ was used for the circularly symmetric field, but this shows only small improvement over the longer readout and loses the advantages of acquiring the entire image in a single echo.

Figure 7:
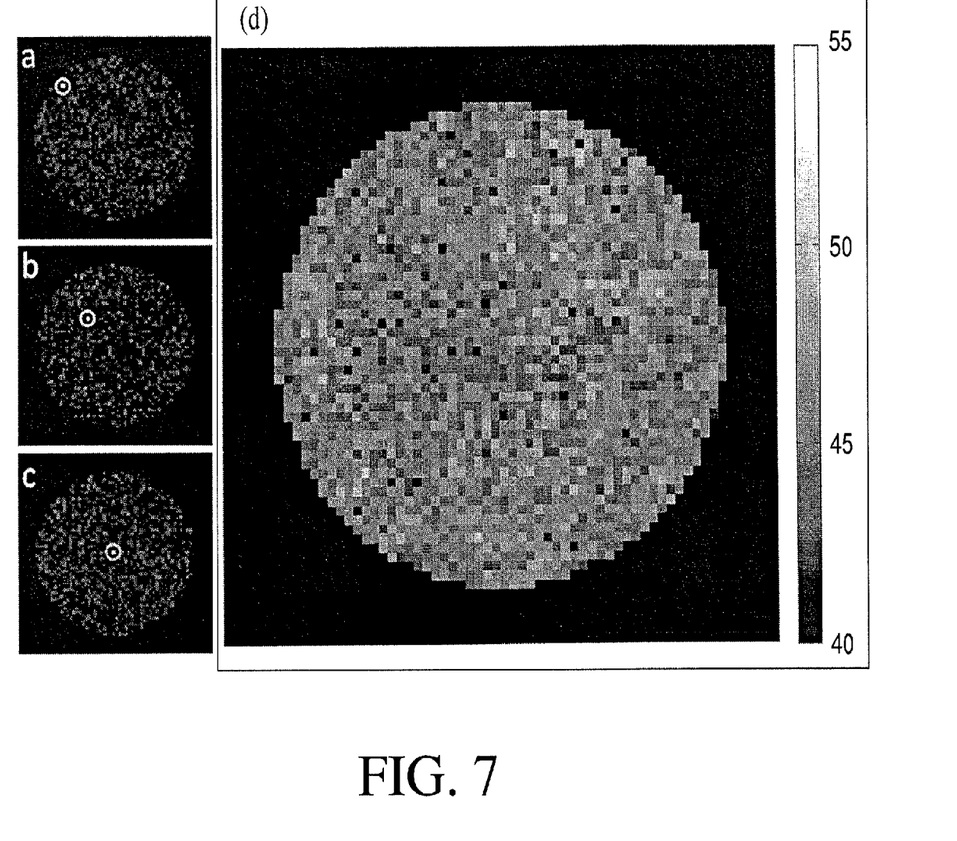

In addition, a metric reflecting the ability to localize signal in different parts of the field of view was also calculated and mapped. FIG. 7 shows three individual single point image reconstructions along with a map reporting the intensity observed at the target voxel divided by the average intensity in all other voxels. As can be seen in panels a-c, the proposed trajectory results in highly incoherent noise-like artifacts but no significant blurring. These trajectories result in a relatively uniform sensitivity across the field of view.

Discussion

Dynamically changing the gradient amplitude in sequences that use nonlinear gradients can open a complex parameter space that makes sequence design challenging. Due to memory constraints and the structure of the simulation program used in accordance with the present invention, simulations were only feasible to a $128^2$ resolution, but the finer images could be reconstructed by doubling the number of sample points in a single echo. Still higher resolution reconstructions may also require only an extended readout, still acquiring data for the entire image in a single short echo.

By focusing on the code of each voxel, sequences are determined that encode the entire image in a single readout. Redundancies in the code are kept spatially separated such that the coil sensitivity profiles from parallel receiver arrays can resolve the resulting ambiguities. While the examples shown here used C3, S3 gradients combined with an off-center Z2 gradient, a wide-range of gradient shapes could potentially be explored to yield single echo images. The important feature is to design dynamic gradient trajectories that impose a unique phase and frequency temporal signal on each voxel in the FOV in order to spatially localize each voxel. This approach abandons the constraints that Fourier transform theory conventionally imposes in terms of the data required to reconstruct an image and yields a highly efficient encoding strategy.

The use of extremely smooth sinusoidally varying gradient amplitudes makes it possible to play these out on very short time scales without violating physiological peripheral nerve stimulation limits. Using these techniques, it may be feasible to acquire a $64^2$ image in as little as 4 ms using only a single echo acquisition.

It is appreciated that this approach differs from existing methods in that it imposes a unique time varying phase frequency signature on each voxel in the field of view through the spatial rotation and amplitude modulation of nonlinear gradient fields in its current form, noting that it may be possible in the future to impose such codes using transmitted RF signals rather than magnetic field gradients. The reconstruction can be as simple as solving a general linear model wherein the phasors created by the rotating/oscillating field are fit to the resultant data. This is the only MR spatial encoding approach to date that allows reconstruction of a complete image from a single line of coded data. This approach to spatial encoding is general and could apply to most pulse sequences that generate the wide range of contrasts used in clinical MRI. This would have widespread application in brain imaging, in cardiac MRI, in musculoskeletal imaging, vascular imaging, imaging of the female pelvis, gynecologic imaging, cancer imaging, liver MRI, and functional imaging. The approach can be used to obtain low resolution MRI images with very short acquisition times (say 4 ms or less) or to obtain high resolution anatomic scans with slightly longer imaging times either through longer sampling windows or multiple echoes. This approach could impact all MRI acquisition strategies.

In the above discussion it has been shown that a particular combination of $1^{st}$, $2^{nd}$, and $3^{rd}$ order gradients can impose semi-unique time/phase/frequency codes on the individual voxels with redundancies in this code easily separated by the parallel coil receivers. There are numerous patterns of such gradient combinations ($1^{st}$ and $2^{nd}$ order only), or some combination of $1^{st}$ through $4^{th}$ order gradients, that could be devised to again impose unique time/phase/frequency signatures on voxels such that an image can be reconstructed from a single echo. While magnetic field gradients have traditionally been used to impose such time/phase/frequency patterns it is appreciated that such patterns could be imposed in the future using RF transmit coils rather than gradient hardware. Hoult D I, Rotating frame zeugmatography., J. Magn. Reson. 1979: 33: 183-197, Sharp J C, King S B, MRI using radio frequency magnetic field phase gradients, Magn. Reson. in Med. 63: 151-161, 2010. As such, it is appreciated the key factor is the creation of unique time/phase/frequency signatures across the field of view such that the entire image can be encoded with only 1 line of data.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by appended claims.

The invention claimed is:

1. A method for increasing imaging speeds in MRI, comprising:
   dynamically generating nonlinear magnetic gradient fields for spatial encoding of nuclear spin magnetization and dynamically modulating the magnetic gradient fields such that the nonlinear magnetic gradient fields vary in time;
   applying pulse sequences composed of magnetic gradient fields and radio frequency fields to a targeted subject to generate magnetic resonance signals;
   detecting and measuring the generated magnetic resonance signals over a period of time;
   storing the generated magnetic resonance signals;
   generating a time code for each pixel of an image; and
   processing the generated magnetic resonance signals to reconstruct spectra or images of the object, wherein so long as the time code for each pixel is sufficiently unique the measured generated magnetic resonance signals are used in the creation of the images.

2. The method according to claim 1, wherein the nonlinear magnetic gradient fields impose a spatially localizable time code.

3. The method according to claim 1, further including the step of measuring spatial phase and frequency of protons over time.

4. The method according to claim 1, wherein a complete image is reconstructed from a single echo.

5. The method according to claim 1, wherein a complete image is reconstructed from one or more than one echo and if multiple echoes are used each with a different code.

6. The method according to claim 1, wherein the step of applying includes applying the nonlinear magnetic gradient field to impose a phase and frequency temporal signal on each voxel in the field of view in order to spatially localize each voxel.

7. The method according to claim 1, wherein the step of dynamically generating further includes dynamically generating linear magnetic fields.

8. An MRI system increasing imaging speeds in MRI, comprising:
   a magnet housing;
   a superconducting magnet generating a magnet field to which the patient is subjected;
   shim coils;
   gradient coils creating a nonlinear magnetic gradient field and dynamically modulating the nonlinear magnetic gradient field over time;
   RF coils;
   receiver coils detecting generated magnetic resonance signals over a period of time;
   a control system linked to the various operation components of the MRI system under the control of an operator of the MRI system, the control system dynamically generating and modulating the nonlinear magnetic gradient field, controlling the application of applying pulse sequences composed of magnetic gradient fields and radio frequency fields to a targeted subject to generate the magnetic resonance signals, measuring the generated magnetic resonance signals over a period of time, storing the generated magnetic resonance signals, generating time code for each pixel of an image, and processing the generated magnetic resonance signals to reconstruct spectra and images of the object, wherein the time code for each pixel is the measured generated magnetic resonance signals used in the creation of the images; and
   a patient table.

9. The MRI system according to claim 8, further including measurement circuitry producing data used to reconstruct images displayed on a display.

10. The MRI system according to claim 8, wherein the nonlinear magnetic gradient field impose a code.

11. The MRI system according to claim 8, wherein the nonlinear magnetic gradient fields imposes a unique time course on each pixel in the resulting image.

12. The MRI system according to claim 8, wherein the MRI system reconstructs a complete image from a single echo.

13. The MRI system according to claim 8, wherein the MRI system reconstructs a complete image from one or more echoes formed by combinations of linear and nonlinear gradients.

14. The MRI system according to claim 8, wherein the nonlinear magnetic gradient field imposes a phase and frequency temporal signal on each voxel in the field of view in order to spatially localize each voxel.

* * * * *